United States Patent [19]

Ikeda et al.

[11] Patent Number: 5,311,164
[45] Date of Patent: May 10, 1994

[54] SURGE ABSORBER

[75] Inventors: Fujio Ikeda; Kazuyuki Arai, both of Saitama, Japan

[73] Assignee: Mitsubishi Materials Corporation, Tokyo, Japan

[21] Appl. No.: 959,033

[22] Filed: Oct. 8, 1992

[30] Foreign Application Priority Data

Oct. 17, 1991 [JP] Japan .................... 3-298265

[51] Int. Cl.⁵ .................... H01H 83/00; H02H 9/04
[52] U.S. Cl. .................... 337/28; 361/124
[58] Field of Search .................... 337/28, 30, 31, 32, 337/34, 16; 361/124, 117, 118, 131, 104

[56] References Cited

U.S. PATENT DOCUMENTS 4,288,833 9/1981 Howell .................... 337/16

Primary Examiner—Harold Broome
Attorney, Agent, or Firm—McAulay Fisher Nissen Goldberg & Kiel

[57] ABSTRACT

A MELF (Metal Electrode Face Bonding Device) surge absorbing element which can be connected across a pair of input lines of an electronic device. The surge absorbing element is secured in electrical contact with the input lines by a conductive heat releasable adhering means, e.g., a solder. A spring is positioned in biased relationship against the surge absorbing element. When the surge absorbing element is subjected to overvoltages or overcurrents continuously across the input lines, the surge absorbing element heats up, which, in turn, heats the adhering means. When the temperature reaches a predetermined value, the adhering means releases its securement of the surge absorbing element, e.g., the solder melts, and no longer holds the element. When this occurs, the bias of the spring means positioned against the now unsecured surge absorbing element serves to move the element away from and out of electrical contact with the adhering means and, in turn, the input lines. This prevents further heating of the surge absorbing element.

6 Claims, 2 Drawing Sheets

SURGE ABSORBER

BACKGROUND OF THE INVENTION

This invention relates to a surge absorber suitable for electronic communication equipment, such as, telephone sets, facsimiles, telephone switch-boards, modems, and the like. More particularly, it relates to a surge absorber capable of protecting electronic devices from the invasion of continuous overvoltages or overcurrents in addition to absorbing surge voltages applied to the electronic device.

In the prior art, the surge absorbing element is connected to a pair of input lines of an electronic device in parallel with the electronic device, and is designed to operate at a higher voltage than the operating voltage of the electronic device. Such a prior art surge absorbing element is a resistor having a high resistance value when the voltage applied thereto is lower than the discharge starting voltage thereof, but its resistance value is equal to as low as several tens of ohms or less when the voltage applied thereto is equal to or higher than the discharge starting voltage thereof. When surge voltages, such as, lightning surges, etc., are instantaneously applied to an electronic device, the surge absorbing element discharges to absorb the surge voltages, and serves to protect the electronic device from the surge voltages. However, when overvoltages or overcurrents due to accidents are continuously applied to the electronic circuit including the electronic device, a certain amount of current continuously flows through the surge absorbing element. This results in the surge absorbing element being heated to high temperatures. The heat radiating from the surge absorbing element can cause the electronic equipment surrounding the surge absorbing element to catch fire. Such accidents include a case where, for example, a power supply line connected to the electronic device comes into contact with a communication line connected to the electronic device.

While it does not usually happen that such accidental overvoltages or overcurrents are continuously applied to the circuit, it has recently become more desirable in many fields to take the maximum safety measures to avoid such accidental problems. As an example, UL (Underwriter's Laboratories Inc.) of the U.S.A. prescribes a safety standard for surge absorbers so that they do not cause fire or electrical shock in communication equipment when continuous overvoltages or overcurrents are applied.

Conventionally, for a surge absorber to conform with such safety standards, a surge absorbing element is known in which a fuse is adhered on and connected to one-side of the input lines of the electronic device. However, heating of the surge absorbing element cannot be prevented if it is subjected continuously with to an alternating-current less than the rated current of the fuse and an overvoltage equal to or more than the operation voltage of the surge absorbing element.

To solve this problem, as shown in FIGS. 4 and 5, the surge absorbing element 14 is connected in series with a fuse wire 20. The fuse wire 20 is fused (melted) from the heat of the surge absorbing element 14.

By using the surge absorber described above, damage to the surge absorbing element and the electronic device can be prevented by fusing when the overvoltages or overcurrents are applied thereon. However, the device is disadvantageous in that it requires many man-hours for connecting the fuse wire, and is not suitable for mass production. In addition, caution must be taken in handling it so that the fuse wire is not cut erroneously by the hands or fingers after the fuse wire is connected.

SUMMARY OF THE INVENTION

An object of the invention is to provide a surge absorber capable of preventing abnormal overheating of the surge absorbing element and thermal damage, fire, and the like, of the electronic device when there is an invasion of continuous overvoltages or overcurrents, in addition to absorbing instantaneous surge voltages, such as, lightning surges.

Another object of the invention is to provide a surge absorber having a simplified construction suitable for mass production and which does not require cautions for handling after being manufactured.

These objects are achieved by the inventive surge absorber which comprises a MELF (Metal Electrode Face Bonding Device) surge absorbing element which can be connected across a pair of input lines of an electronic device. The surge absorbing element is secured in electrical contact with the input lines by a conductive heat releasable adhering means, e.g., a solder. A spring is positioned in biased relationship against the surge absorbing element. When the surge absorbing element is subjected to overvoltages or overcurrents continuously across the input lines, the surge absorbing element heats up, which, in turn, heats the adhering means. When the temperature reaches a predetermined value, the adhering means releases its securement of the surge absorbing element, e.g., the solder melts and no longer holds the element. When this occurs, the bias of the spring means positioned against the now unsecured surge absorbing element serves to move the element away from and out of electrical contact with the adhering means and, in turn, the input lines. This prevents further heating of the surge absorbing element.

DESCRIPTION OF THE PREFERRED EMBODIMENT

Figure 1:
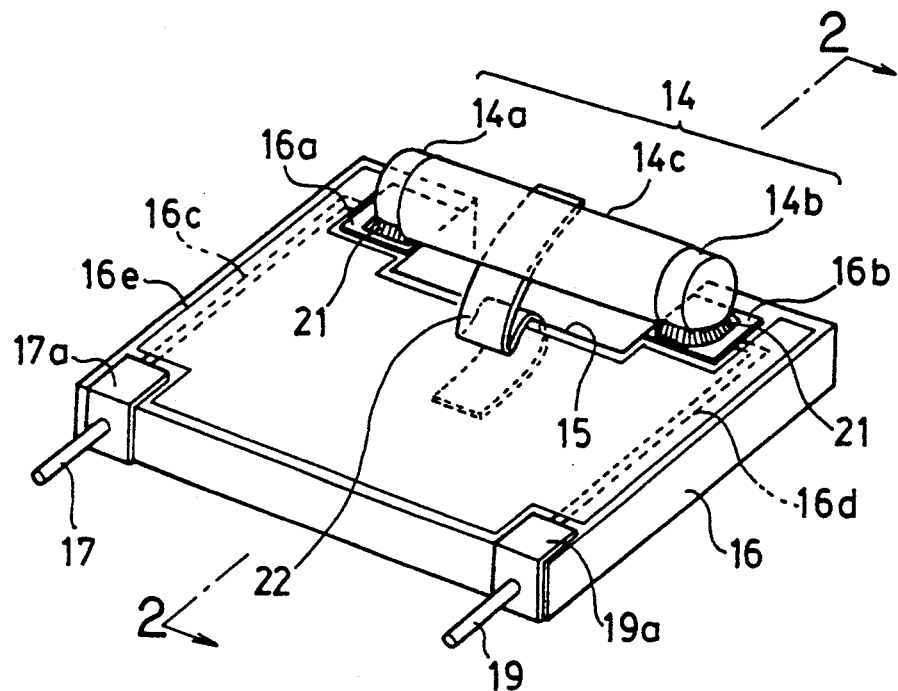
FIG. 1 is a perspective view of a surge absorber according to the invention.
Figure 2:
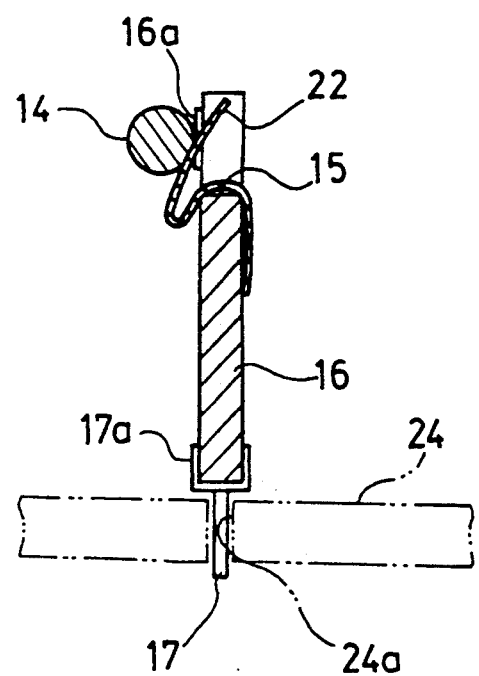
FIG. 2 is a sectional view of the surge absorber, taken along the line 2—2 of FIG. 1.
Figure 3:
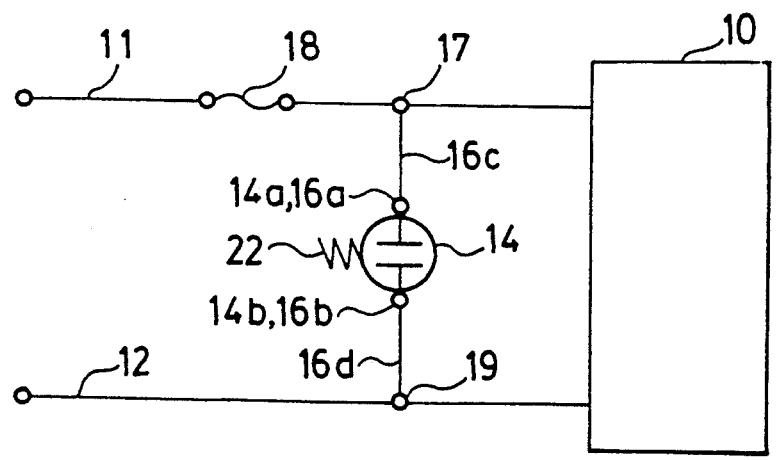
FIG. 3 is a surge absorbing circuit including the surge absorber of FIG. 2.

The surge absorber according to the invention, as shown in FIGS. 1 and 3, is an improved apparatus for absorbing surges in which a surge absorbing element of MELF type 14 is connected to a pair of input lines 11 and 12 of an electronic device 10 in parallel with the electronic device 10.

The surge absorber according to the invention has a pair of leads 17, 19 connected respectively to a pair of input lines 11, 12, arranged on a base member 16, a concavity, i.e., slot or hole 15 having a width less than surge absorbing element 14 is formed in the base member 16. A pair of electrode connectors 16a, 16b, connected respectively, to leads 17, 19 are formed on a front surface of the base member 16 on each side of concavity 15. Electrode connectors 16a and 16b provide a site of contact for electrodes 14a, 14b, respectively, of the surge absorbing element 14. End electrodes 14a, 14b of the surge absorbing element 14 are soldered, respectively, to the pair of the electrode connectors 16a, 16b by solder 21. Spring member 22 for moving the surge absorbing element 14 so as to separate it from the base member 16 is provided between an edge end of the concavity or hole 15 and a body 14c of the soldered surge absorbing element 14, and in biased position against surge absorbing element 14.

Examples of an MELF (Metal Electrode Face Bonding Device) type surge absorbing element according to the invention include a gap type surge absorbing element which is cylindrical and without lead wire, such as, an air-gap type discharge tube, a micro-gap type discharge tube and the like.

In this specification, an overvoltage or overcurrent means an abnormal voltage greater than the discharge starting voltage of the surge absorbing element and the abnormal current accompanying it.

In the surge absorber according to the invention, when the surge absorbing element 14 itself is heated from invasion by overvoltages or overcurrents continuously across the input lines 11 and 12, the solder 21 for fixing both end electrodes 14a and 14b to the base member 16 is melted and the elastic force of the spring member 22 separates the surge absorbing element 14 from the base member 16.

The conventional surge absorber is not suitable for a mass production system because substantial man-hours are required for connecting the fuse wire 20. Also, caution is required for its handling. The inventive surge absorber is suitable for a mass production system and requires less man-hours due to its simplified structure. Also, it can be easily handled and caution is not required for its handling after being manufactured.

An example of the present invention and a comparative example will be described in detail with reference to the accompanying drawings.

EXAMPLE

As shown in FIGS. 1 and 3, a MELF type surge absorbing element 14 is connected to a pair of input lines 11 and 12 of an electronic device 10 of communication equipment in parallel with the electronic device 10. A fuse 18 is connected to a one-side 11 of the input lines of the surge absorbing element 14 and the electronic device 10. The fuse 18 and the surge absorbing element 14 constitute a surge absorber.

In this example, the MELF type surge absorbing element 14 is a micro-gap type discharge tube having a discharge starting voltage of 300 V. Element 14 is made in the following way: At first, a micro-gap of a several ten μm is formed in the circumferential direction of a cylindrical ceramic element body enveloped with a conductive film. Then, cap electrodes are forced into both ends of the ceramic element body by pressure, and this is inserted into a cylindrical glass 14c. Then, electrodes 14a and 14b for the MELF are inserted in the both ends of the glass 14c, followed by sealing.

The surge absorbing element 14 is fixed on the base member 16, that is, a pair of leads 17 and 19 connected to a pair of input lines 11 and 12, respectively, are arranged on the bottom end of the base member 16 through conductive fixtures 17a and 19a. The distance between leads 17 and 19 is larger than the length of the surge absorbing element 14. An upper end of the base member 16 is formed with a concavity 15, and a pair of electrode connectors 16a and 16b are formed on surface areas of the base member 16 which are right and left sides of that concavity 15. The distance between the pair of the electrode connectors 16a and 16b corresponds to the distance between the end electrodes 14a and 14b of the surge absorbing element 14, such that end electrodes 14a and 14b rest on electrode connectors 16a and 16b, respectively. The electrode connectors 16a and 16b are connected to fixtures 17a and 19a through printed wirings 16c and 16d, and a surface of the base member 16 including such printed wirings 16c and 16d, are coated with resist film 16e.

The surge absorbing element 14 is fixed using a solder 21 by soldering electrodes 14a and 14b to the electrode connectors 16a and 16b. A spring member 22 is forcibly inserted between an edge end of the concavity 15 and secured to body 14c of the surge absorbing element 14. Spring member 22 is a plate spring, which is secured on the base member 16 by engaging the edge end of the concavity 15 of the base member 16. The upper portion of the spring member 22 is biased against body 14c of surge absorbing element 14 so that the element 14 can be separated from the base member 16, on melting of solder 21.

The base member 16 into which the spring member 22 is forcibly inserted is fixed on the circuit base member 24 by inserting the leads 17 and 19 into a through hole 24a.

In the surge absorber constructed as described above, when a surge voltage is instantaneously applied, the fuse 18 does not blow. Also, solder 21 does not melt, and the surge absorbing element 14 absorbs the surges. When a larger current flows continuously in lines 11 and 12 from overvoltage due to an erroneous contact and the like between the input lines 11 and 12 and the power supply lines, fuse 18 does blow. When a current less than a rated current of the fuse 18 flows due to the overvoltage, the surge absorber element 14 is heated. Such heating melts the solder 21 adhering end electrodes 14a and 14b to the base member 16, and the elastic force of spring member 22 separates the surge absorbing element 14 from base member 16. Printed wirings 16c and 16d are coated with the resist films and the interval between the leads 17 and 19 is larger than the interval between the end electrodes 14a and 14b of surge absorbing element 14. As a result, the surge absorbing element 14 is moved out of electrical contact with connectors 16 and 16b and does not short-circuit input lines 11 and 12.

COMPARATIVE EXAMPLE

Figure 4:
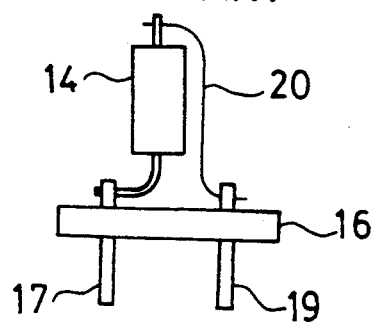
FIG. 4 is a front view of a surge absorber used in a comparative example.
Figure 5:
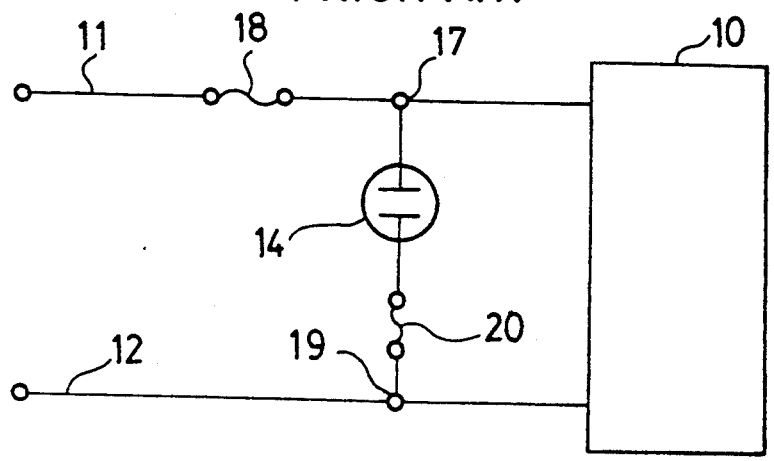
FIG. 5 is a surge absorbing circuit including the surge absorber of FIG. 4.

In FIGS. 4 and 5, a surge absorber as a comparative example is shown. The same reference numerals with FIGS. 1 and 3 designate the same constituent parts. A fuse wire 20 is connected in series with surge absorbing element 14.

The tests for the overvoltages and overcurrents concerning the surge absorbers of the example and the comparative example were carried out as follows: In test (a), a voltage of AC 600 V was applied across input lines 11 and 12 of a test circuit with a current flow of 2.2 A. In test (b), a voltage of AC 600 V was applied with a current flow of 0.25 A.

As a result, in test (a), the fuse wire 20 of the surge absorber of the comparative example blew in about two seconds after the test voltage was applied. On the other hand, the solder 21 of the surge absorber of the example blew in about two seconds after the test voltage was applied, thereby separating the surge absorbing element 14 from the base member 16. In test (b), the fuse wire 20 of the surge absorber of the comparative example blew in about ten seconds after the test voltage was applied. On the other hand, the solder 21 of the surge absorber of the example melted in about five seconds after the test voltage was applied, thereby allowing the separation of both surge absorbing element 14 from the base member 16. In both in the comparative example and the example, firing of the surge absorbing element was not observed in the tests (a) and (b).

The pseudo surge tests concerning the surge absorbers of the example and the comparative example were performed. The pseudo surge of $8 \times 20\mu$ seconds was applied across the input lines 11 and 12 of the test circuit. The current value of the pseudo surge was varied in 100 A increment in the range of 300 A to 1200 A. The fuse wire 20 of the comparative example blew at a current of 400 A. On the other hand, the surge absorber of the example was broken open at a current of 1200 A, and this proved that a surge resisting current thereof is 1200 A.

In the above example, the concavity is provided on the base member, however, it may be a hole or slot. In addition, in the example, the printed wirings 16c and 16d are provided on the surface of the base member and these are coated by resist films 16e. However, the printed wirings may be arranged on the rear side of the base member by providing through holes in the vicinity of the electrode connectors 16a and 16b.

What is claimed is:

1. A surge absorber comprising
   a MELF surge absorbing element connectable across a pair of input lines of an electronic device and having a pair of electrodes for respective electrical connection to each of the input lines;
   conductive, heat-releasable adhering means for securing the surge absorbing element in electrical contact with the input lines, which, upon warming of the surge absorbing element to a predetermined temperature, becomes non-adhering and releases the securement of the surge absorbing element;
   spring means biased against the surge absorbing element for moving the surge absorbing element out of electrical contact with the input lines when the adhering means becomes non-adhering and releases the securement of the surge absorbing element; and
   a base having a flat surface and a slot in the surface for engaging a portion of the spring means, a pair of electrode connectors adapted for contacting each of the electrodes, respectively, the connectors being positioned on the surface and opposing each other across the slot, each of the electrodes being secured to a respective connector by the adhering means, the surge absorbing element being positioned so as to traverse the slot, the base having leads for electrically connecting each of the connectors to one of the respective input lines, and the spring means being positioned to engage the slot and the surge absorbing element and bias the element away from the base.

2. The surge absorber of claim 1 wherein the base has a printed circuit connecting the leads to the connectors.

3. The surge absorber of claim 2 wherein the printed circuit is on the surface of the base.

4. The surge absorber of claim 1 wherein the base is a plate having first and second opposing flat surfaces, the slot is an opening through the plate, the connectors and surge absorbing element being positioned on the first surface, the base having a printed circuit for connecting the leads to the connectors on the second surface.

5. The surge absorber of claim 2 wherein the printed circuit is coated with an insulating film.

6. The surge absorber of claim 4 wherein the spring member is an S-shaped flat spring having a mid portion positioned in the opening, one end portion biased against the second surface and another end portion biased against the surge absorbing element on the first surface.

* * * * *